US012400862B2

(12) United States Patent
Yang et al.

(10) Patent No.: US 12,400,862 B2
(45) Date of Patent: Aug. 26, 2025

(54) INTERCONNECT STRUCTURES AND METHODS AND APPARATUSES FOR FORMING THE SAME

(71) Applicant: Taiwan Semiconductor Manufacturing Co., Ltd., Hsinchu (TW)

(72) Inventors: Chun-Hsu Yang, Hsinchu (TW); Chun-Sheng Chen, Hsinchu (TW); Nai-Hao Yang, Keelung (TW); Kuan-Chia Chen, Hsinchu (TW); Huei-Wen Hsieh, Hsinchu (TW); Yu-Cheng Hsiao, Taipei (TW); Che-Wei Tien, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 90 days.

(21) Appl. No.: 17/883,965

(22) Filed: Aug. 9, 2022

(65) Prior Publication Data

US 2022/0384255 A1  Dec. 1, 2022

Related U.S. Application Data

(62) Division of application No. 16/896,591, filed on Jun. 9, 2020, now Pat. No. 11,694,899.

(Continued)

(51) Int. Cl.
*H01J 37/32* (2006.01)
*C23C 14/18* (2006.01)
(Continued)

(52) U.S. Cl.
CPC ........ *H01L 21/28568* (2013.01); *C23C 14/18* (2013.01); *C23C 14/34* (2013.01);
(Continued)

(58) Field of Classification Search
CPC ............. H01J 37/3244; H01J 37/32633; H01J 37/3426; H01J 2237/332; H01J 2237/002;
(Continued)

(56) References Cited

U.S. PATENT DOCUMENTS 3,130,563 A * 4/1964 Wood ...................... B64G 7/00
165/171
4,494,381 A * 1/1985 Lessard ................... F04B 37/08
428/116

(Continued)

FOREIGN PATENT DOCUMENTS

JP         07-070733      *  3/1995

OTHER PUBLICATIONS

Machine Translation of JP 07-070733 (Year: 1995).*
Akiyama et al. "Design and Performance of Cryopump", J-Stage, 1965 vol. 8 Issue 9 pp. 299-307. (Year: 1965).*

*Primary Examiner* — Rodney G McDonald
(74) *Attorney, Agent, or Firm* — Slater Matsil, LLP

(57) ABSTRACT

Interconnect structures and methods and apparatuses for forming the same are disclosed. In an embodiment, a method includes supplying a process gas to a process chamber; igniting the process gas into a plasma in the process chamber; reducing a pressure of the process chamber to less than 0.3 mTorr; and after reducing the pressure of the process chamber, depositing a conductive layer on a substrate in the process chamber.

20 Claims, 11 Drawing Sheets

Related U.S. Application Data

(60) Provisional application No. 62/963,392, filed on Jan. 20, 2020, provisional application No. 62/959,337, filed on Jan. 10, 2020.

(51) Int. Cl.
   *C23C 14/34* (2006.01)
   *H01J 37/34* (2006.01)
   *H01L 21/285* (2006.01)
   *H01L 21/321* (2006.01)
   *H01L 21/768* (2006.01)

(52) U.S. Cl.
   CPC .... *H01J 37/3244* (2013.01); *H01J 37/32633* (2013.01); *H01J 37/3426* (2013.01); *H01L 21/3212* (2013.01); *H01L 21/76831* (2013.01); *H01L 21/7684* (2013.01); *H01L 21/76846* (2013.01); *H01L 21/76853* (2013.01); *H01L 21/76877* (2013.01); *H01L 21/76882* (2013.01); *H01J 2237/002* (2013.01); *H01J 2237/332* (2013.01)

(58) Field of Classification Search
   CPC ... C23C 14/18; C23C 14/34; H01L 21/28568; H01L 21/76846; H01L 21/76882; H01L 21/7684; H01L 21/3212; H01L 21/76831; H01L 21/76853; H01L 21/76877
   USPC .................................................. 204/298.07
   See application file for complete search history.

(56) References Cited

U.S. PATENT DOCUMENTS

| | | | | |
|---|---|---|---|---|
| 4,990,229 | A | * | 2/1991 | Campbell ............ H01J 37/3211 204/298.37 |
| 5,685,963 | A | * | 11/1997 | Lorimer .................. F04B 37/02 118/724 |
| 5,830,330 | A | * | 11/1998 | Lantsman ............ H01J 37/3405 204/192.12 |
| RE36,610 | E | * | 3/2000 | Okumura .............. F04D 19/046 62/55.5 |
| 8,097,133 | B2 | * | 1/2012 | Inagawa ........... H01J 37/32449 204/298.22 |
| 2003/0106326 | A1 | * | 6/2003 | Sekimoto ................ F17C 3/085 62/51.1 |
| 2009/0220777 | A1 | * | 9/2009 | Sporn ..................... C23C 14/34 204/192.15 |
| 2013/0192276 | A1 | * | 8/2013 | Tanaka .................... B23P 15/26 29/888.021 |
| 2018/0151424 | A1 | | 5/2018 | Yao et al. |
| 2019/0164748 | A1 | | 5/2019 | Chou et al. |

* cited by examiner

INTERCONNECT STRUCTURES AND METHODS AND APPARATUSES FOR FORMING THE SAME

PRIORITY CLAIM AND CROSS-REFERENCE

This application is a divisional of U.S. patent application Ser. No. 16/896,591, filed on Jun. 9, 2020, entitled "Interconnect Structures and Methods and Apparatuses for Forming the Same," which claims the benefit of U.S. Provisional Application No. 62/959,337, filed on Jan. 10, 2020, and U.S. Provisional Application No. 62/963,392, filed on Jan. 20, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
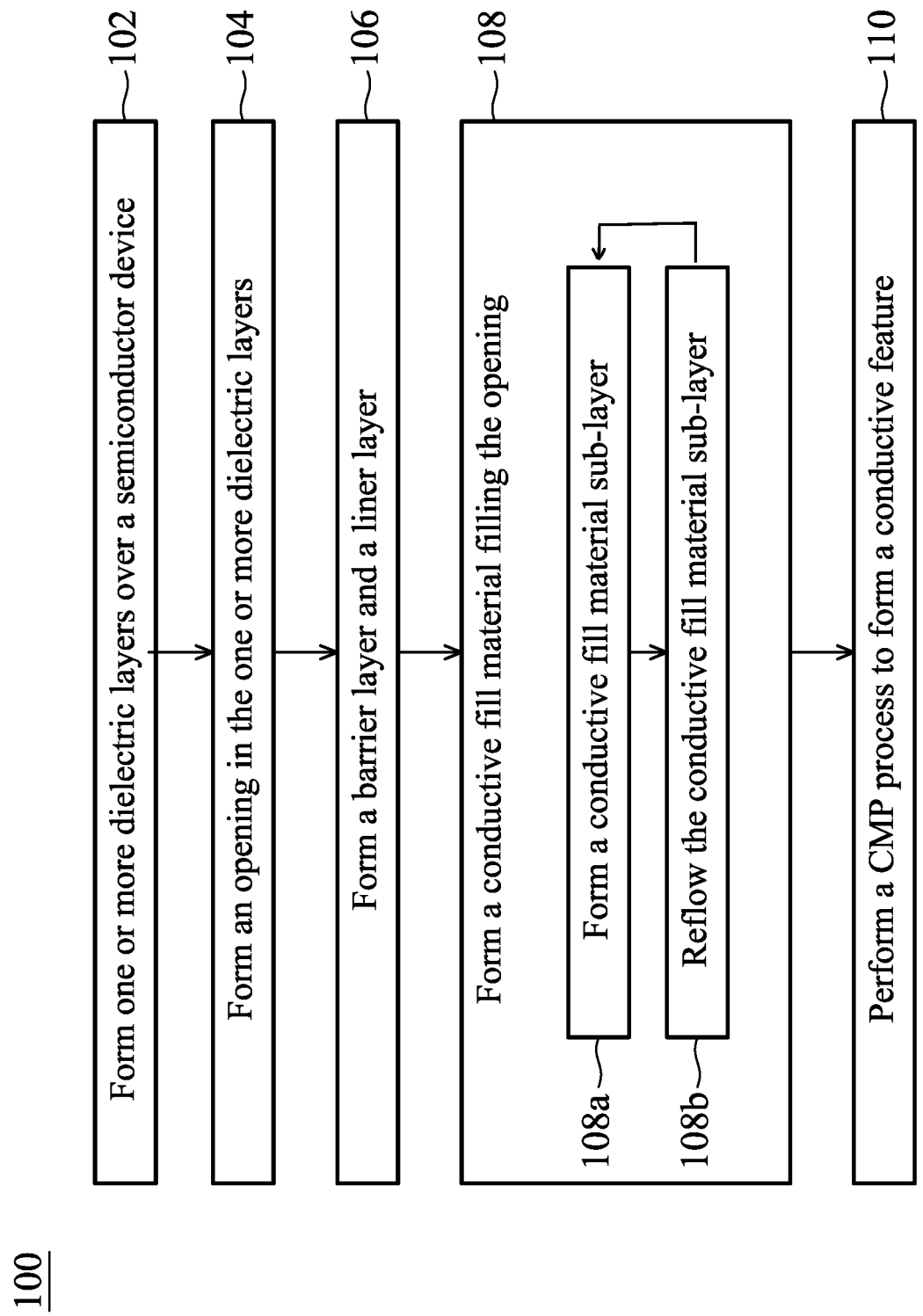
FIGS. 1A and 1B are flow charts illustrating an example method for fabricating an interconnect structure of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments relate generally to one or more methods for forming interconnect structures, interconnect structures formed by the same, and an apparatus for forming interconnect structures. The interconnect structures may be used in semiconductor processing. The interconnect structures may include conductive features, which are formed by depositing one or more conductive layers in an opening formed in a dielectric layer. The conductive layer may be deposited by a low-pressure physical vapor deposition process and reflowed. The interconnect structures may be formed in a process chamber of the apparatus. The low-pressure vapor deposition process may include an ignition stage, an intermediate stage in which the pressure of the process chamber is reduced, and a deposition stage. The apparatus may further include a cryopump or the like, which may be used to quickly reduce the pressure of the process chamber in the intermediate stage. In some embodiments, the conductive features may be deposited with improved conformity, less overhang at corners of the opening in the dielectric layer, minimal voids and seems, and the like. Semiconductor devices including the interconnect structure may experience improved device performance and reduced device defects.

Some of the embodiments included herein may be described in the context of forming conductive features in back end of the line (BEOL) processing. However, aspects of the present disclosure may be used in other processes, such as forming conductive features in front end of the line (FEOL) processing, middle of the line (MOL) processing, or the like. Embodiments discussed herein merely provide examples to enable making or using the subject matter of this disclosure, and a person having ordinary skill in the art will readily understand modifications that can be made while remaining within contemplated scopes of different embodiments. Moreover, although method embodiments may be described as being performed in a particular order, various steps may be added, removed, replaced, rearranged, or repeated. Throughout the various views and illustrative embodiments, like reference numbers are used to designate like elements.

Figure 1B:
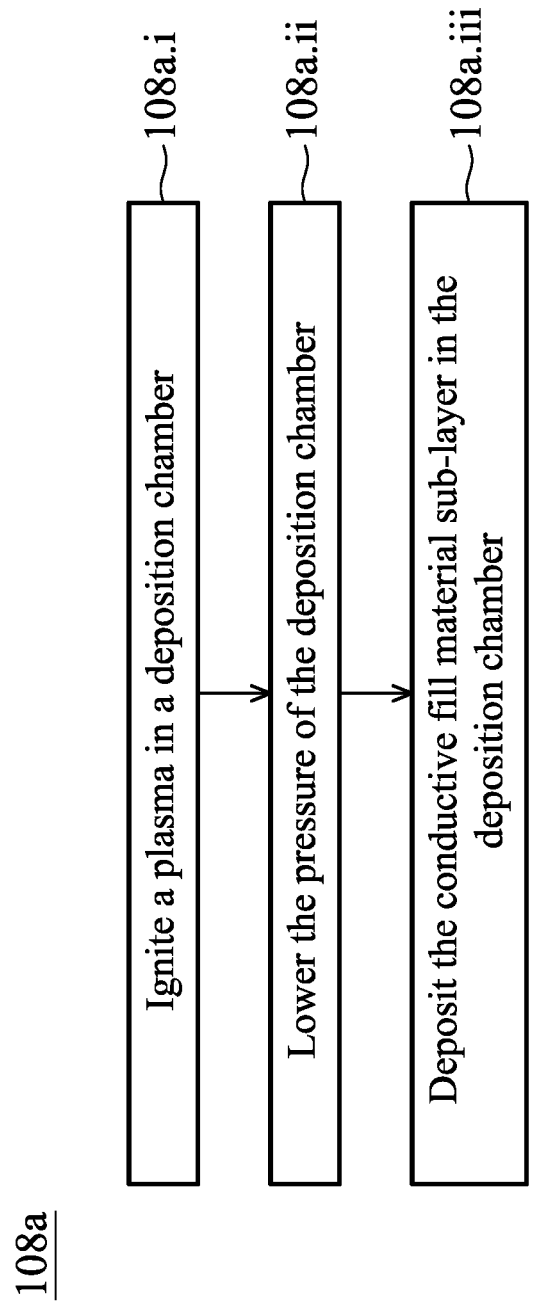
Figure 3:
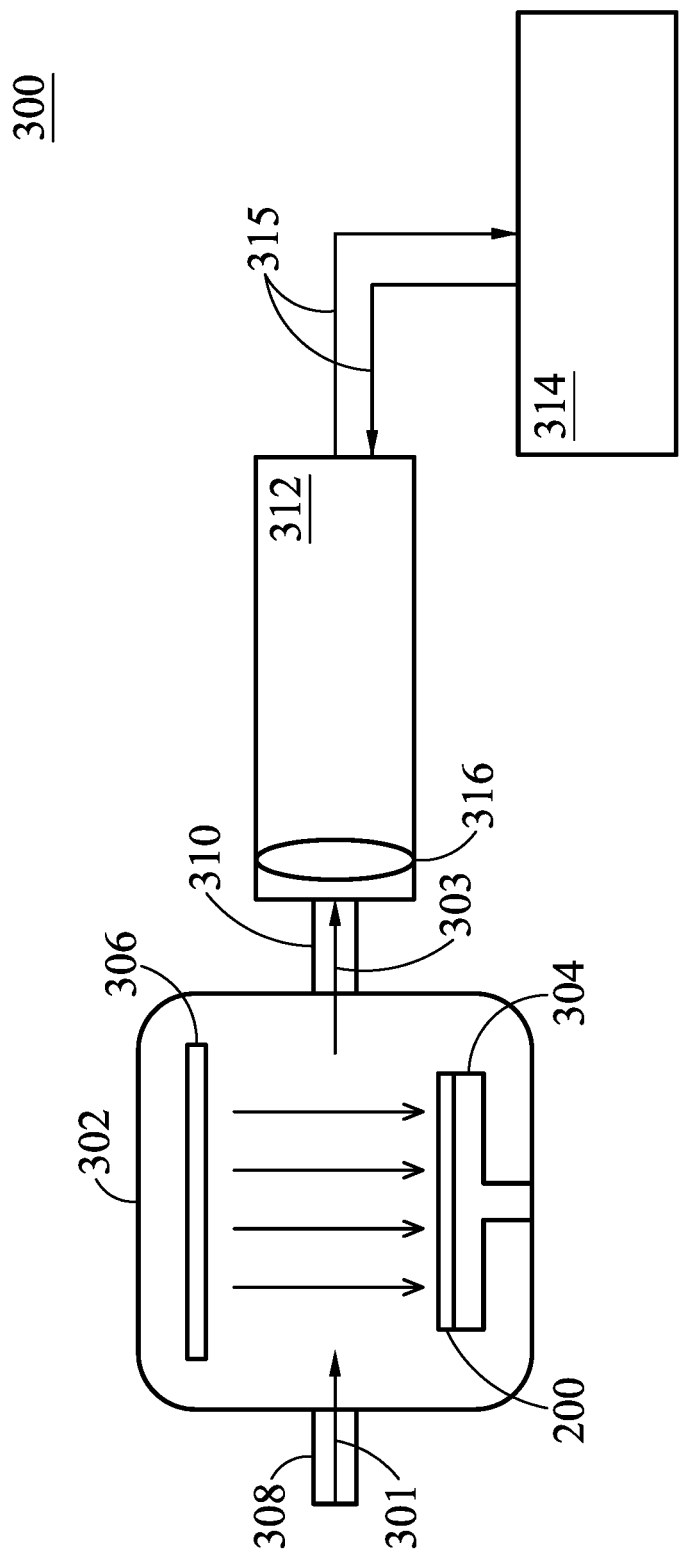
FIG. 3 illustrates a cross-sectional view of an apparatus for fabricating an interconnect structure of a semiconductor device, in accordance with some embodiments.
Figure 4:
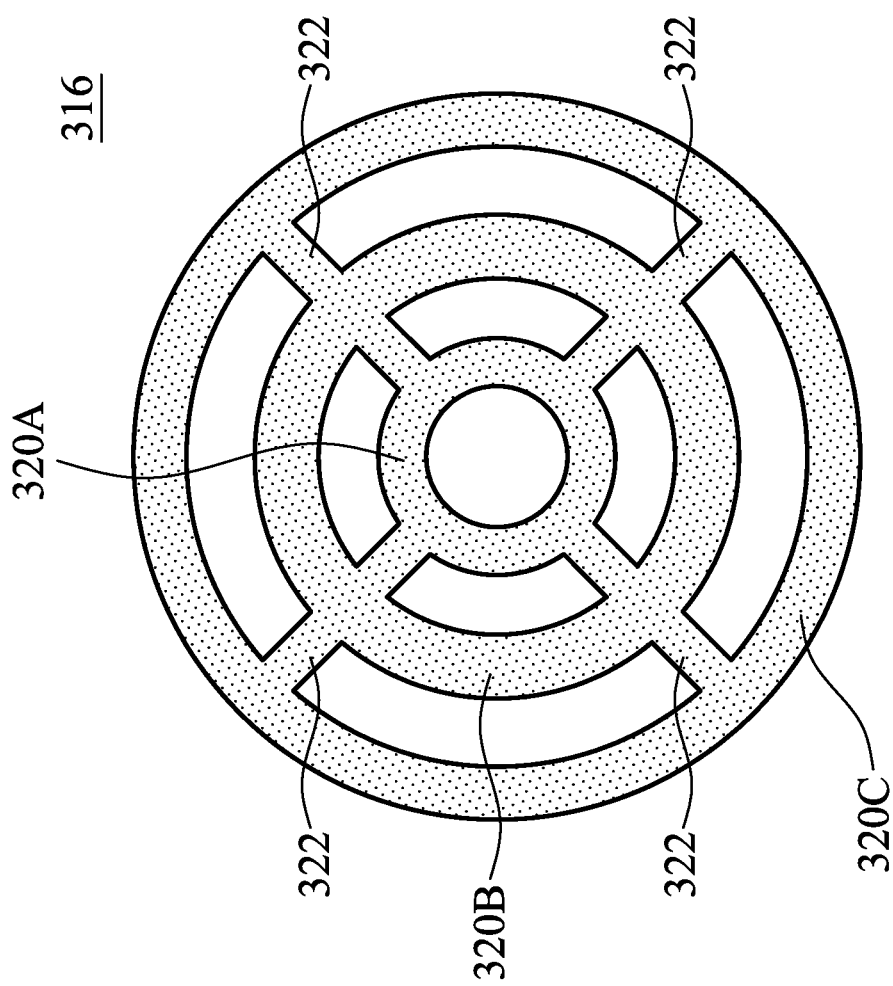
FIG. 4 illustrates a cross-sectional view of a baffle included in a pump of an apparatus for fabricating an interconnect structure of a semiconductor device, in accordance with some embodiments.

FIGS. 1A and 1B are flow charts of an example method 100 and an example operation 108a of the method 100, respectively, for fabricating an interconnect structure, in accordance with some embodiments. FIGS. 2A through 2G illustrate cross-sectional views of the semiconductor device at various stages of fabrication according to the method of FIG. 1A. FIG. 3 illustrates a cross-sectional view of an apparatus 300 in which the interconnect structure may be deposited. FIG. 4 illustrates a cross-sectional view of a baffle 316 which may be included in a pump 312 included in the apparatus 300.

Figure 2A:
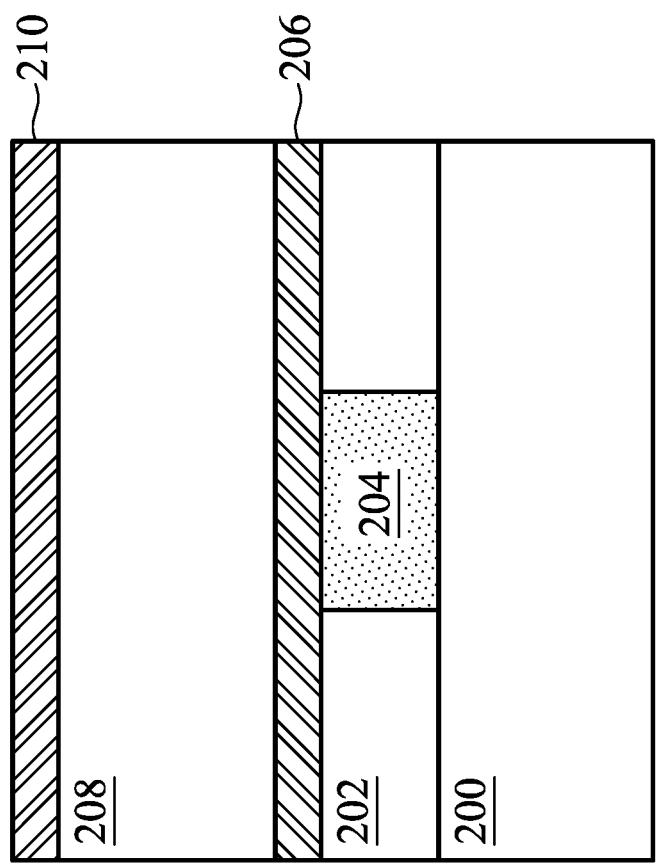
FIGS. 2A through 2G illustrate cross-sectional views of a semiconductor device at various stages of fabrication, in accordance with some embodiments.

FIG. 2A and operation 102 of the method 100 illustrate the formation of various layers (e.g., a first dielectric layer 202, a conductive feature 204, an etch stop layer 206, a second dielectric layer 208, and a dielectric cap layer 210) over a substrate 200. The substrate 200 may be or include a bulk semiconductor, a semiconductor-on-insulator (SOI) substrate, or the like, which may be doped (e.g., with a p-type or an n-type dopant) or undoped. In some embodiments, the semiconductor material of the substrate 200 may include an elemental semiconductor such as silicon (Si) or germanium (Ge); a compound semiconductor; an alloy semiconductor; or a combination thereof.

Various devices may be formed on the substrate 200. For example, the substrate 200 may include field effect transistors (FETs), such as nanostructure (e.g., nanosheet, nanowire, gate-all-around, or the like) FETs (NSFETs), fin FETs, planar FETs, vertical gate all around FETs (VGAA FETs), or the like; diodes; capacitors; inductors; other devices; or combinations thereof. The devices may be formed wholly within the substrate 200, partially within the substrate 200 and partially within one or more overlying layers, and/or wholly within one or more overlying layers, for example. Processing described herein may be used to form and/or to interconnect the devices to form an integrated circuit (IC). The integrated circuit can be any circuit, such as for an application specific integrated circuit (ASIC), a processor, a memory, or any other circuit.

A first dielectric layer 202 is formed over the substrate 200. The first dielectric layer 202 may be directly on the substrate 200, or any number of other layers may be disposed between the first dielectric layer 202 and the substrate 200. For example, the first dielectric layer 202 may be or include an inter-metal dielectric (IMD) or an interlayer dielectric (ILD). In some embodiments, the first dielectric layer 202 may be or include a low-dielectric constant (low-k) material having a k-value less than about 4.0, such as about 2.0 or even less. In some embodiments, the first dielectric layer 202 includes silicon oxide, phosphosilicate glass (PSG), borophosphosilicate glass (BPSG), fluorosilicate glass (FSG), $SiO_xC_y$, a silicon carbon material, a compound thereof, a composite thereof, or a combination thereof.

A conductive feature 204 is formed in and/or extending through the first dielectric layer 202. The conductive feature 204 may be or include a conductive line and/or a conductive via, a gate structure of a transistor, or a contact plug to a gate structure of a transistor and/or to a source/drain region of a transistor. In some embodiments, the first dielectric layer 202 may be an IMD, and the conductive feature 204 may include a conductive line and/or a conductive via (collectively or individually referred to as an "interconnect structure"). The conductive feature 204 may be formed by forming an opening and/or recess through and/or in the dielectric layer 202, for example, using a damascene process. Some examples of forming an interconnect structure are described further below, although other processes and interconnect structures may be implemented. In some embodiments, the first dielectric layer 202 may include an ILD, and the conductive feature 204 may include a gate electrode (formed of, e.g., tungsten, cobalt, or the like) in the ILD formed using a replacement gate process. In some embodiments, the first dielectric layer 202 may be an ILD and the conductive feature 204 may include a contact plug. The conductive feature 204 may be formed by forming an opening extending through the first dielectric layer 202 to a gate electrode and/or a source/drain region of a transistor formed on the substrate 200. The conductive feature 204 may include an adhesion layer (formed of, e.g., Ti or the like), a barrier layer (formed of, e.g., TiN or the like) on the adhesion layer, and a conductive fill material (formed of, e.g., tungsten, cobalt, or the like) on the barrier layer. The conductive feature 204 may also be made of a less diffusive metal, such as tungsten (W), molybdenum (Mo), or ruthenium (Ru) without a barrier layer. A planarization process, such as a chemical mechanical polish (CMP) process, may be performed on the conductive feature 204 and the first dielectric layer 202 such that top surfaces of the conductive feature 204 and the first dielectric layer 202 are coplanar, as shown in FIG. 2A.

An etch stop layer 206 is formed over the first dielectric layer 202 and the conductive feature 204. The first etch stop layer 206 may be included to provide a mechanism to stop an etch process when forming, e.g., contacts or conductive vias (such as the second conductive feature 222, discussed below with respect to FIG. 2G) over the conductive feature 204. The etch stop layer 206 may be formed of a dielectric material having a different etch selectivity from adjacent layers or components. The etch stop layer 206 may be deposited on the top surfaces of the first dielectric layer 202 and the conductive feature 204. The etch stop layer 206 may include or be silicon nitride, silicon carbon nitride, silicon carbon oxide, carbon nitride, the like, or a combination thereof. The etch stop layer 206 may be deposited by chemical vapor deposition (CVD), plasma-enhanced CVD (PECVD), atomic layer deposition (ALD), or another suitable deposition technique.

A second dielectric layer 208 is formed over the etch stop layer 206. The second dielectric layer 208 may be used as an insulating layer. In some embodiments, the second dielectric layer 208 may be or include a low-k material having a k-value less than about 4.0, such as about 2.0 or even less. In some embodiments, the second dielectric layer 208 may include silicon oxide, phosphosilicate glass (PSG), borophosphosilicate glass (BPSG), fluorosilicate glass (FSG), undoped silicate glass (USG), $SiO_xC_y$, a silicon carbon material, an organic polymer, spin-on glass (SOG), a compound thereof, a composite thereof, or a combination thereof.

A dielectric cap layer 210 is formed over the second dielectric layer 208. The dielectric cap layer 210 may be used to suppress or minimize reflections from the underlying layers which are reflective of patterned energy used in subsequent lithographic processes. As such, the dielectric cap layer 210 may also be referred to as an anti-reflective coating layer. Suitable materials for the dielectric cap layer 210 may include silicon oxide, silicon oxycarbide, silicon oxynitride, hydrocarbon-containing silicon oxide, silicon nitride, titanium nitride, tantalum nitride, titanium-containing material, tantalum-containing material, an organic material, multiple layers or combinations thereof, or the like. In some embodiments, the dielectric cap layer 210 is a nitrogen-free material, such as a nitrogen-free oxide. In some embodiments, the dielectric cap layer 210 is a nitrogen-free silicon oxycarbide. The dielectric cap layer 210 may be formed over the second dielectric layer 208 using any suitable technique, such as CVD, PECVD, high-density plasma CVD (HDP-CVD), a spin-on coating process, or the like. Planarization processes, such as a CMP process, may be performed to planarize the second dielectric layer 208 and/or the dielectric cap layer 210.

Figure 2B:
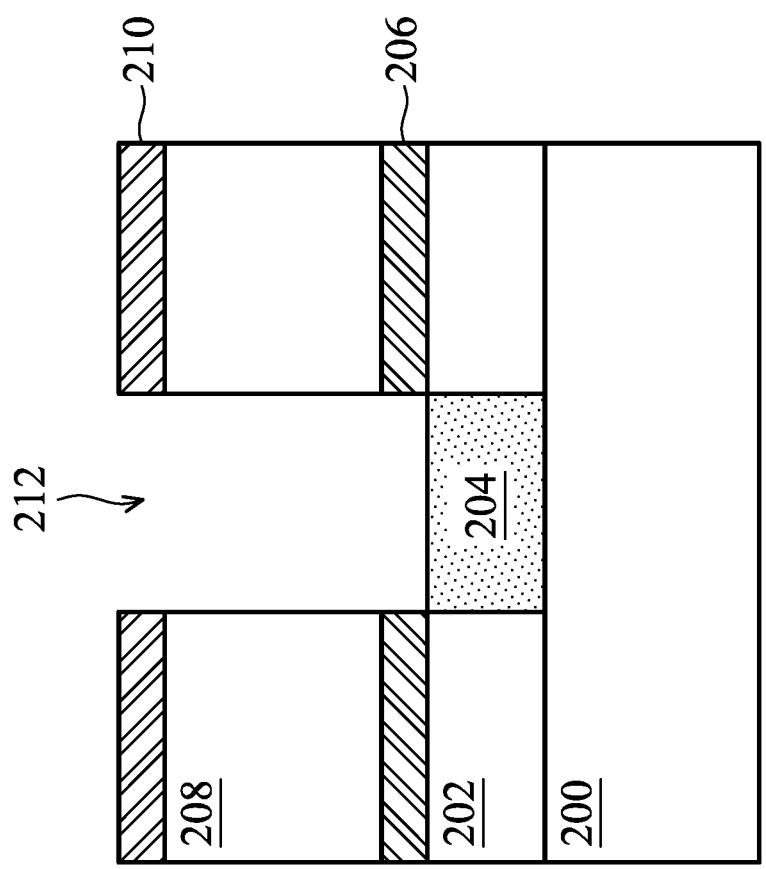

FIG. 2B and operation 104 of the method 100 illustrate the formation of an opening 212 extending through the dielectric cap layer 210, the second dielectric layer 208, and the etch stop layer 206. The opening 212 may be formed using photolithography and etch processes. For example, a photoresist may be formed on the dielectric cap layer 210, such as by using spin-on coating, and patterned with a pattern corresponding to the opening 212 by exposing the photoresist to a patterned energy source (e.g., a patterned light source). Exposed or unexposed portions of the photoresist may then be removed depending on whether a positive or negative photoresist is used. The pattern of the photoresist may be transferred to the dielectric cap layer 210, the second dielectric layer 208, and the etch stop layer 206, such as by using one or more suitable etch processes. In some embodiments, the etch processes may include a reactive ion etch (RIE), a neutral beam etch (NBE), an inductive coupled plasma (ICP) etch, the like, or a combination thereof. The etch processes may be anisotropic. The photoresist may be removed in an ashing or wet strip process.

Additional mask layers, such as hardmask layers or photoresist layers, may be utilized to facilitate forming the opening 212 in the dielectric cap layer 210, the second dielectric layer 208, and the etch stop layer 206. Conductive features (such as the second conductive feature 222, discussed below with respect to FIG. 2G) may be formed in the opening 212 and may be electrically connected with the conductive feature 204. The opening 212 may include any opening, such as including a trench with a via opening to the conductive feature 204, which may be formed using a dual damascene process. In an embodiment, the opening 212 may have a height from about 200 Å to about 600 Å or from about 250 Å to about 350 Å and a width from about 120 Å to about 250 Å or from about 140 Å to about 180 Å. The opening 212 may have an aspect ratio (e.g., a ratio of the height to the width) from about 3 to about 6 or from about 3.5 to about 4.5.

Figure 2C:
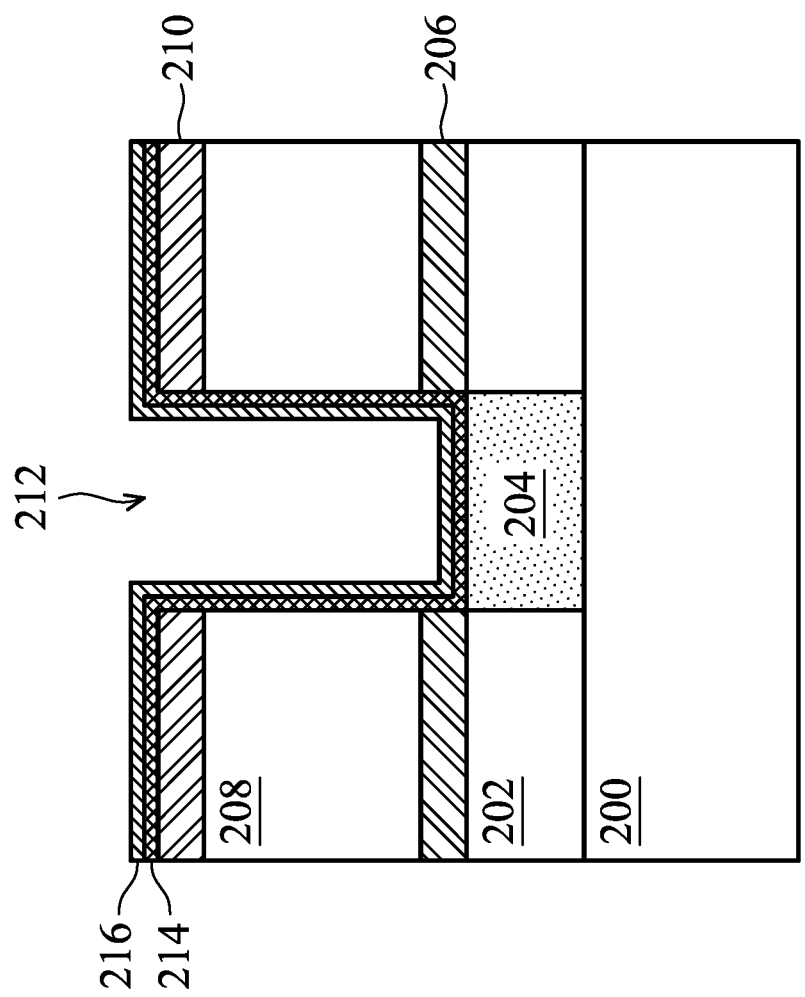

FIG. 2C and operation 106 of the method 100 illustrate the formation of a barrier layer 214 and a liner layer 216 over the conductive feature 204, the dielectric cap layer 210, the second dielectric layer 208, and the etch stop layer 206. As illustrated in FIG. 2C, the barrier layer 214 may be formed along top surfaces of the conductive feature 204 and the dielectric cap layer 210 and along sidewalls of the dielectric cap layer 210, the second dielectric layer 208, and the etch stop layer 206. The barrier layer 214 may be conformally deposited using a process such as ALD, CVD, or the like. Suitable materials for the barrier layer 214 may include titanium nitride, titanium oxide, tantalum nitride, tantalum oxide, multiple layers or combinations thereof, or the like. The barrier layer 214 may have a thickness from about 4 Å to about 35 Å or from about 17.5 Å to about 22.5 Å.

The liner layer 216 may then be formed along top surfaces and sidewalls of the barrier layer 214. The liner layer 216 may be conformally deposited using a process such as ALD, CVD, PVD, or the like. Suitable materials for the liner layer 216 may include cobalt, tungsten, copper, ruthenium, aluminum, gold, silver, alloys thereof, multiple layers or combinations thereof, or the like. The liner layer 216 may have a thickness from about 5 Å to about 50 Å or from about 25 Å to about 30 Å.

Figure 2D:
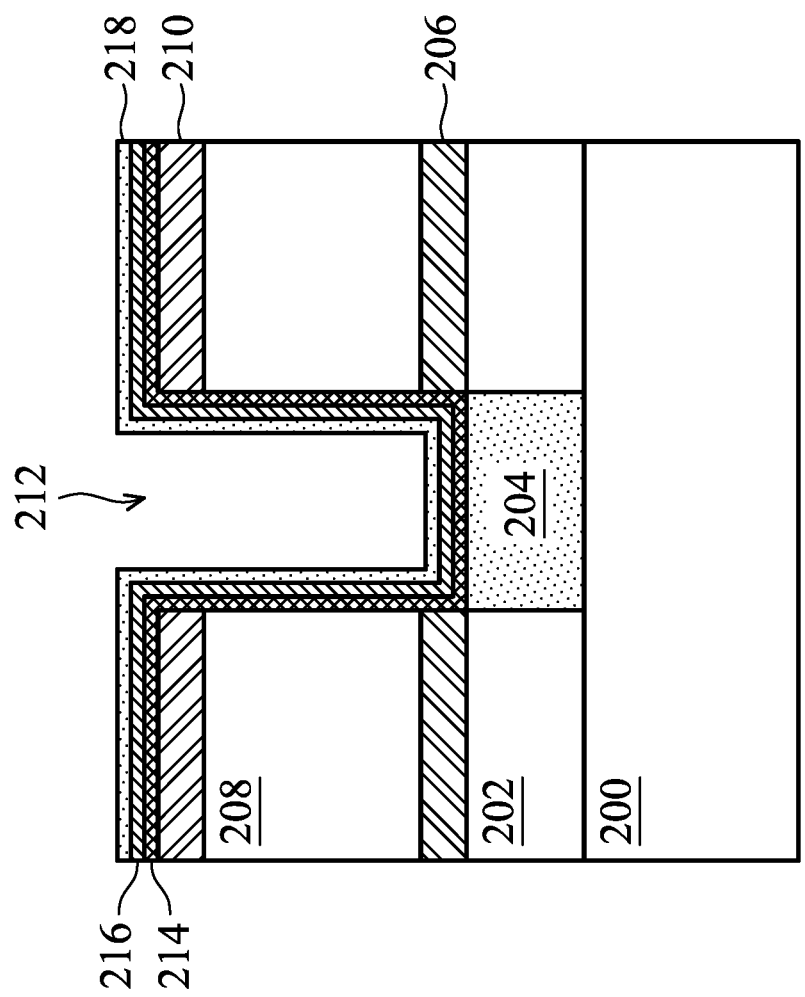
Figure 2E:
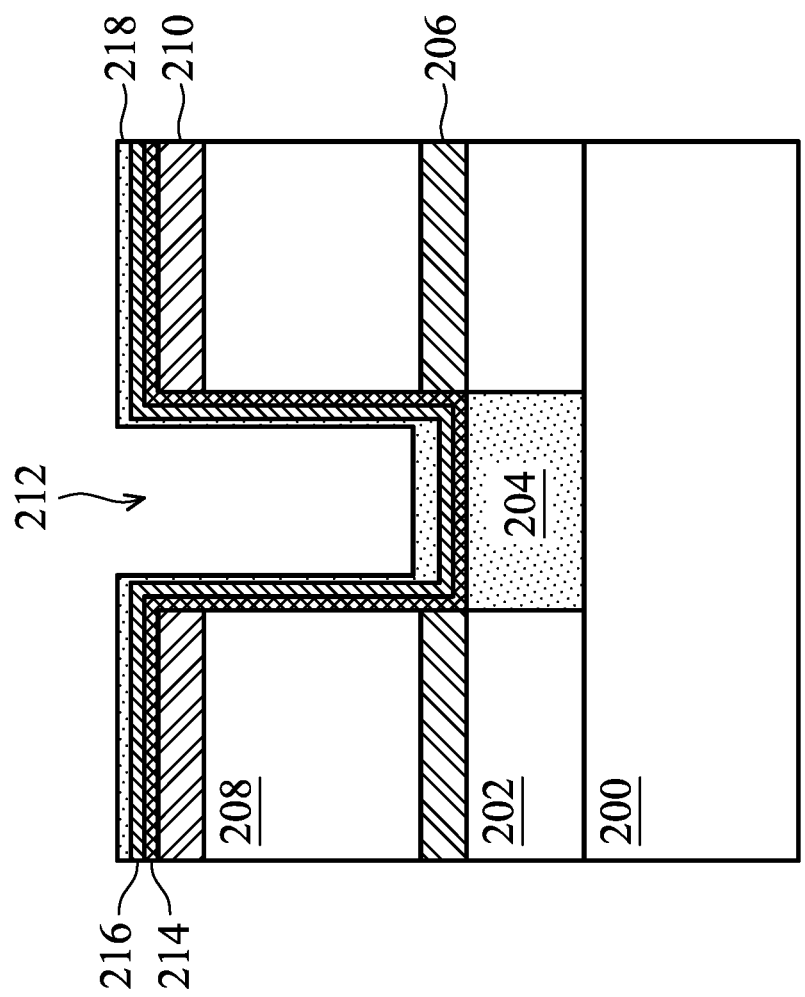
Figure 2F:
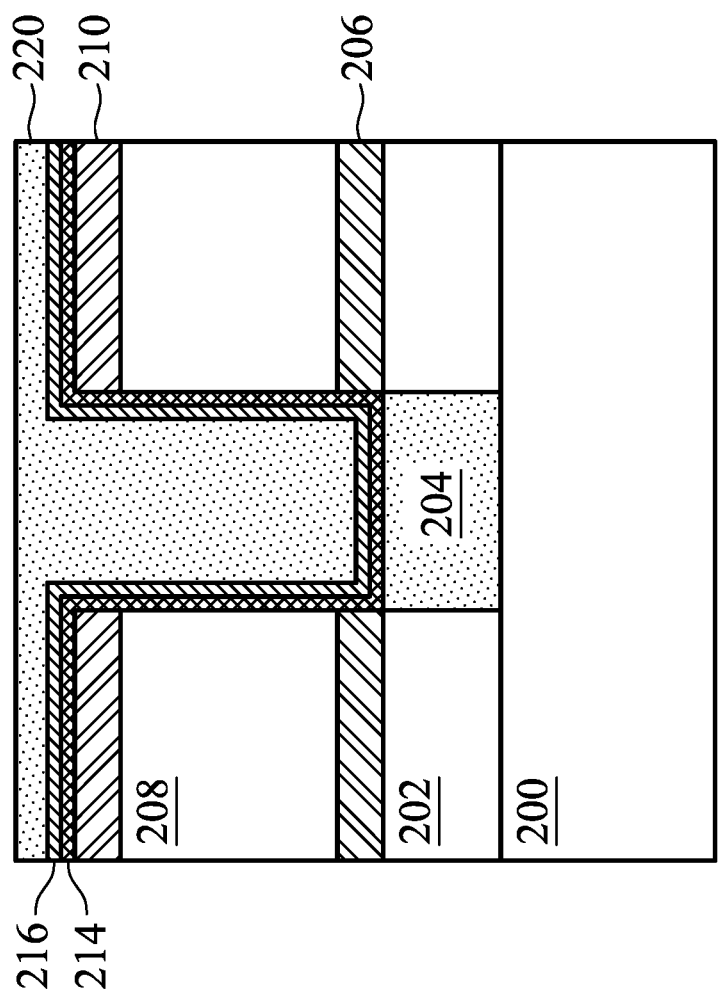

The operation 108, illustrated in FIGS. 2D-2F, may include operations 108a and 108b. In FIG. 2D and at operation 108a of the method 100, a conductive layer 218 is formed over the liner layer 216. As illustrated in FIG. 2D, the conductive layer 218 may be conformally deposited along top surfaces and sidewalls of the liner layer 216. The conductive layer 218 may be deposited using a PVD process, such as sputter deposition, or the like. In a specific embodiment, the conductive layer 218 may be deposited by sputtering material from a target onto the liner layer 216. Suitable examples of materials which may be used for the target and the conductive layer 218 include cobalt, tungsten, copper, ruthenium, aluminum, gold, silver, alloys or combinations thereof, or the like.

FIG. 1B provides additional details for the operation 108a of the method 100. As illustrated in FIG. 1B, the operation 108a includes operation 108a.i, wherein a plasma is ignited in a process chamber (e.g., an ignition stage), operation 108a.ii, wherein the pressure of the process chamber is lowered (e.g., an intermediate stage), and operation 108a.iii, wherein the conductive layer 218 is deposited in the process chamber (e.g., a deposition stage). The operation 108a may be referred to as a three-stage deposition process. The process chamber may be maintained at room temperature, such as between about 5° C. and about 50° C., throughout the three-stage deposition process.

In the ignition stage, the substrate 200 is placed in the process chamber and a plasma is ignited in the process chamber between the target and the substrate 200. The process chamber may be maintained at a pressure from about 3 mTorr to about 15 mTorr, from about 8 mTorr to about 12 mTorr, greater than about 3 mTorr, or greater than 10 mTorr during the ignition stage. The plasma may be ignited from a process gas introduced between the target and the substrate 200. The process gas may be argon (Ar), helium (He), xenon (Xe), a combination thereof, or the like. The process gas may be supplied to the process chamber at a flowrate from about 8 sccm to about 100 sccm or from about 40 sccm to about 60 sccm. The plasma may be ignited by supplying a DC power to the target. The DC power may be from about 1 kW to about 40 kW, from about 1 kW to about 3 kW, from about 1 kW to about 5 kW, less than about 5 kW, or less than about 3 kW.

During the ignition stage, the target may be bombarded with energetic particles from the plasma, which may cause source particles (e.g., atoms, ions, and the like) to be ejected from the target. The source particles from the target may be deposited on the substrate 200, may cause other source particles to be ejected from the target, may become part of the plasma, or the like. The ignition stage may be carried out for a time ranging from about 3 seconds to about 10 seconds or from about 5 seconds to about 7 seconds.

In the intermediate stage, supply of the process gas to the process chamber is stopped, and a pump (such as the pump 312, discussed below with respect to FIG. 3) begins removing gas and plasma from the process chamber. The pump reduces the pressure of the process chamber. Specifically, in some embodiments, the pump may reduce the pressure in the process chamber to from about 0.01 mTorr to about 0.3 mTorr or from about 0.05 mTorr to about 0.15 mTorr at the end of the intermediate stage. The pump may pump the gas and plasma from the process chamber at a rate from about 500 L/sec to about 2,500 L/sec or from about 1,250 L/sec to about 1,750 L/sec.

Reducing the pressure of the process chamber makes it harder to maintain the plasma in the process chamber. As such, the DC power supplied to the target may be increased in order to maintain the plasma in the process chamber. In some embodiments, the DC power supplied to the target may be increased to greater than about 15 kW, less than about 40 kW, from about 15 kW to about 40 kW, or from about 20 kW to about 25 kW.

In the intermediate stage, the target may continue to be bombarded with the energetic particles from the plasma, including both the process particles from the process gas and the source particles, generating more ejected source particles. Because gas and plasma are pumped from the process chamber and the supply of process gas to the chamber is ceased, the concentration of the particles from the process gas in the plasma may decrease relative to the concentration of the source particles. At the end of the intermediate stage, an atomic concentration of the source particles in the process chamber may be from about 90% to about 99.9% or from about 94% to about 96% and an atomic concentration of the process particles in the process chamber may be from about 0.1% to about 10%, from about 4% to about 6%, or less than about 10%. The intermediate stage may be carried out for a time ranging from about 2 seconds to about 10 seconds, from about 2 seconds to about 4 seconds, or less than about 8 seconds.

In the deposition stage, the source particles are deposited on the liner layer 216 to form the conductive layer 218. During the deposition stage, the pressure of the process chamber may be from about 0.01 mTorr to about 0.3 mTorr or from about 0.05 mTorr to about 0.15 mTorr. The DC power supplied to the target may be increased to greater than about 30 kW, less than about 50 kW, from about 30 kW to about 50 kW, or from about 35 kW to about 40 kW. The deposition stage may be carried out for a time ranging from about 2 seconds to about 50 seconds or from about 6 seconds to about 10 seconds. The conductive layer 218 deposited in each operation 108a may be deposited to a thickness from about 40 Å to about 200 Å or from about 80 Å to about 120 Å.

The deposition of the conductive layer 218 may further be controlled throughout the operation 108a (e.g., minimized during the ignition stage and the intermediate stage and maximized during the deposition stage) using an applied AC bias power, electromagnetic field, and/or DC shield bias power. During the ignition stage and the intermediate stage, the AC bias power may be from about 0 W to about 700 W or from about 0 W to about 60 W, the electromagnetic field may be supplied with a current from about 0 A to about 25 A, and the DC shield bias power may be from about 0 V to about 100 V. During the deposition stage, the AC bias power may be from about 20 W to about 700 W or from about 450 W to about 550 W, the electromagnetic field may be supplied with a current from about 0 A to about 25 A or from about 17.5 A to about 22.5 A, and the DC shield bias power may be from about 1 V to about 100 V or from about 85 V to about 95 V.

Reducing the concentration of the process particles in the process chamber and reducing the pressure of the process chamber before the deposition stage increases mean free paths of the process particles and reduces collisions of the source particles with the process particles. This improves collimation of the source particles and provides for better coverage of the substrate 200 with each conductive layer 218, reduces any overhangs of the conductive layer 218 at top corners of the openings 212, and provides for better thickness control of the conductive layer 218.

In FIG. 2E and at operation 108b of the method 100, the conductive layer 218 is reflowed. Reflowing the conductive layer 218 causes material of the conductive layer to flow towards the bottom of the openings 212, as illustrated in FIG. 2E. The conductive layer 218 may be reflowed for a period from about 10 seconds to about 300 seconds, or from about 140 seconds to about 160 seconds at a temperature from about 150° C. to about 300° C., or from about 200° C. to about 250° C. In some embodiments, material from the conductive layer 218 may remain on top surfaces of the liner layer 216 over the dielectric cap layer 210 and along sidewalls of the opening 212. In some embodiments, the conductive layer 218 may be reflowed for a sufficient time that substantially all of the material of the conductive layer 218 extending along sidewalls of the opening 212 flows to the bottom of the opening 212.

In FIG. 2F, the operations 108a and 108b are repeated until the conductive layer 218 forms a conductive fill material 220 filling the opening 212. As illustrated in FIG. 2F, the conductive fill material 220 may also extend along top surfaces of the liner layer 216 over the dielectric cap layer 210. The operations 108a and 108b may each be repeated from 1 time to 5 times, such as 2 times in order to deposit the conductive fill material 220.

Figure 2G:
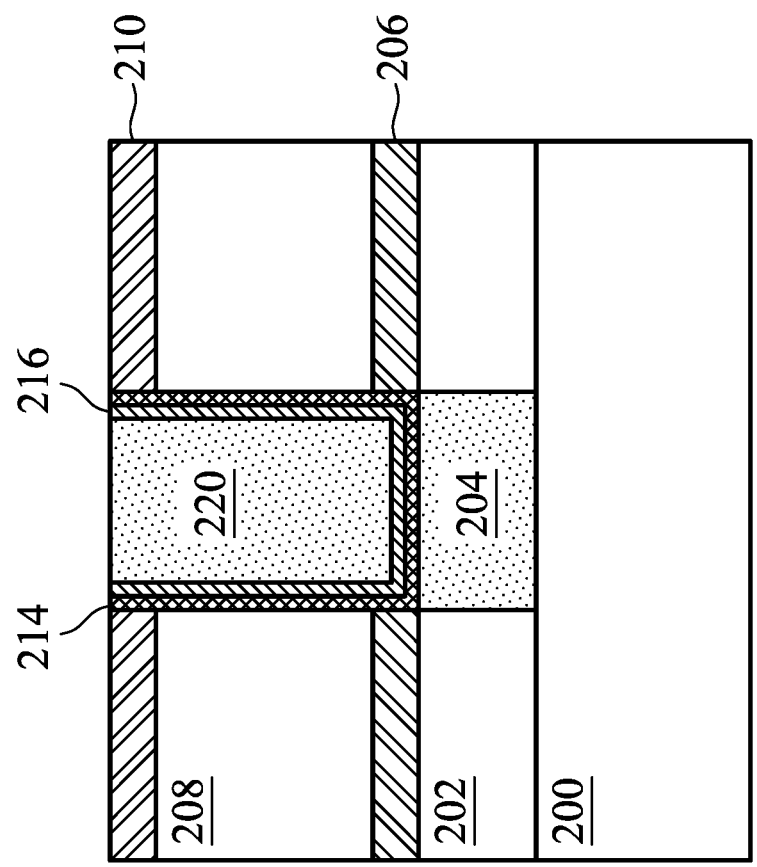

In FIG. 2G and at operation 110, the barrier layer 214, the liner layer 216, and the conductive fill material 220 are planarized using a planarization process. The planarization process may be, for example, a chemical-mechanical polish (CMP). Top surfaces of the dielectric cap layer 210 may also be planarized such that top surfaces of the dielectric cap layer 210 are coplanar with top surfaces of the barrier layer 214, the liner layer 216, and the conductive fill material 220. The barrier layer 214, the liner layer 216, and the conductive fill material may be collectively referred to as a second conductive feature 222.

As discussed previously, using the operation 108a to deposit the conductive layer 218 which form the conductive fill material 220 reduces overhangs, provides better thickness control and coverage, and the like for the conductive layer 218. This ensures that the conductive fill material 220 is formed without seams or voids and semiconductor devices including the conductive fill material 220 have better device performance and less device defects.

FIG. 3 illustrates a cross-sectional view of an apparatus 300 in which the operation 108a of the method 100 may be performed to form the conductive layer 218. The apparatus 300 may include a process chamber 302, a wafer stage 304, a target 306, an inlet 308, and an outlet 310. The outlet 310 may be connected to a pump 312. The pump 312 may receive a liquid coolant 315 from a refrigerator 314. The substrate 200 is disposed on the wafer stage 304 with the dielectric cap layer 210 being exposed on its top surface. In some embodiments, the conductive layer 218 may be deposited using PVD with a process gas 301 excited to a plasma state and used to bombard the target 306.

During the ignition stage, the process gas 301 is introduced into the process chamber 302 through the inlet 308, and may be excited into the plasma state. The process gas may be supplied to the process chamber 302 at a flowrate from about 8 sccm to about 100 sccm or from about 40 sccm to about 50 sccm during the ignition stage. The excited process gas may be used to sputter metal atoms from the overlying target 306. The process gas 301 may be Ar, He, Xe, a combination thereof, or the like. The process chamber 302 may be maintained at a pressure from about 3 mTorr to about 15 mTorr, from about 8 mTorr to about 12 mTorr, greater than about 3 mTorr, or greater than about 10 mTorr during the ignition stage. In some embodiments, a voltage may be applied to the target 306 in the ignition stage and the substrate 200 and the wafer stage 304 may be connected to ground. A DC power ranging from about 1 kW to about 40 kW, from about 1 kW to about 3 kW, from about 1 kW to about 5 kW, less than about 5 kW, or less than about 3 kW may be applied to the target 306 during the ignition stage in order to ignite the process gas 301 into the plasma state between the target 306 and the substrate 200.

During the intermediate stage, the flow of the process gas 301 into the process chamber 302 is ceased and the pump 312 pumps an effluent gas 303 from the process chamber 302. The effluent gas 303 may include atoms or ions of the process gas 301 as well atoms or ions sputtered from the target 306. The effluent gas 303 may be pumped from the process chamber 302 at a flowrate from about 500 L/sec to about 2,500 L/sec or from about 1,250 L/sec to about 1,750 L/sec. The pump 312 may reduce the pressure in the process chamber 302 to from about 0.01 mTorr to about 0.3 mTorr or from about 0.05 mTorr to about 0.15 mTorr in less than about 8 seconds, from about 2 seconds to about 10 seconds, or from about 2 seconds to about 4 seconds. The process chamber 302 may have a volume ranging from about 20 L to about 60 L or from about 45 L to about 55 L. In some embodiments, a DC power ranging from about 15 kW to about 40 kW, from about 20 kW to about 25 kW, greater than about 15 kW, or less than about 40 kW may be applied to the target 306 during the intermediate stage in order to maintain the particles of the process gas 301 and the target 306 in the plasma state between the target 306 and the substrate 200.

In some embodiments, the pump 312 may be a cryopump or the like. For example, the pump 312 may include baffles 316 which are maintained at low temperatures and the effluent gas 303 may be condensed on surfaces of the baffles 316 in order to pump the effluent gas 303 from the process chamber 302. The pump 312 may have an effective surface area from about 500 cm$^2$ to about 4,000 cm$^2$. The pump 312 may include multiple stages in which the baffles 316 are maintained at one or more temperatures. In some embodiments, the pump 312 may include two stages with a first stage being disposed closest to the process chamber 302 and the second stage being disposed furthest form the process chamber 302. The baffles 316 of the first stage may be maintained at a temperature less than about −190° C., from about −160° C. to about −190° C., or from about −165° C. to about −175° C. and the baffles of the second stage 316 may be maintained at a temperature less than about −250° C. or from about −240° C. to about −260° C.

Surfaces of the baffles 316 in the pump 312 may become saturated with the condensed effluent gas 303. As such, the baffles 316 may be regenerated between deposition processes of the conductive layer 218 carried out in the process chamber 302. The pump 312 may be regenerated by allowing the baffles 316 to heat up such that the condensed effluent gas 303 is evaporated. The process chamber 302 may be sealed off form the pump during the regeneration process such that the effluent gas does not reenter the process chamber 302.

The refrigerator 314 is coupled to the pump 312 to provide cooling to the pump 312. The refrigerator 314 may use a liquid coolant 315, such as liquid helium, liquid nitrogen, or the like to cool the baffles 316 of the pump 312. In embodiments in which the pump 312 includes more than one stage, the refrigerator 314 may use more than one liquid coolant 315 to provide different cooling to each stage of the pump 312. For example, in an embodiment including a two-stage pump 312, a first liquid coolant, such as liquid nitrogen may be used to cool the first stage baffles 316 and a second liquid coolant, such as liquid helium, may be used to cool the second stage baffles 316.

In the deposition stage, particles sputtered from the target 306 are deposited on the substrate 200. The process chamber 302 may be maintained at a pressure ranging from about 0.01 mTorr to about 0.3 mTorr or from about 0.05 mTorr to about 0.15 mTorr during the deposition stage. In some embodiments, a DC power ranging from about 30 kW to about 50 kW, from about 35 kW to about 40 kW, greater than about 30 kW, or less than about 50 kW may be applied to the target 306 during the deposition stage such that the particles of the target 306 are deposited on the substrate 200 and the particles of the process gas 301 and the target 306 are maintained in the plasma state between the target 306 and the substrate 200. In some embodiments, the reflow process at operation 108b of the method 100 may also be performed in the process chamber 302.

Reducing the pressure in the process chamber 302 before depositing the conductive layer 218 on the substrate 200 increases mean free paths of particles of the process gas 301 in the process chamber 302 and reduces collisions between particles sputtered from the target 306 and particles of the process gas 301. This improves collimation of the particles sputtered from the target 306, which provides for better coverage of the substrate 200 with the conductive layer 218, and also provides for better thickness control of the conductive layer 218. Moreover, using the pump 312 to remove the effluent gas 303 from the process chamber 302 allows for the effluent gas 303 to be removed from the process chamber 302 quickly, which reduces the time that the plasma state is maintained, reduces cost, and increases throughput.

FIG. 4 illustrates a cross-sectional view of a baffle 316 which may be included in the pump 312. The baffle 316 includes concentric rings 320A-320C, which are connected by support members 322. Although FIG. 4 illustrates a baffle 316 including three concentric rings 320A-320C and four support members 322, the baffle 316 may include any number of concentric rings and any number of support members. The layout illustrated in FIG. 4 may be used to provide a greater surface area to volume ratio for the baffles 316 as compared with conventional baffles.

In accordance with an embodiment, a method includes supplying a process gas to a process chamber; igniting the process gas into a plasma in the process chamber; reducing a pressure of the process chamber to less than 0.3 mTorr; and after reducing the pressure of the process chamber, depositing a conductive layer on a substrate in the process chamber. In an embodiment, the process gas is argon. In an embodiment, the pressure of the process chamber is reduced from greater than 10 mTorr. In an embodiment, the pressure is reduced in less than 8 seconds. In an embodiment, the conductive layer is sputtered from a target, the target including copper. In an embodiment, the plasma is ignited by applying a DC power of less than 5 kW to the target. In an embodiment, a DC power of greater than 15 kW is applied to the target while reducing the pressure of the process chamber, and a DC power of greater than 30 kW is applied to the target while depositing the conductive layer on the substrate. In an embodiment, an atomic concentration of the process gas in the process chamber after reducing the pressure of the process chamber is less than 0.1%.

In accordance with another embodiment, a method includes depositing a barrier layer in an opening extending through a dielectric layer; depositing a liner layer over the barrier layer; and forming a conductive feature filling the opening in a process chamber, forming the conductive feature including generating a plasma from a process gas; pumping the plasma and the process gas from the process chamber at a flowrate from 500 L/sec to about 2,500 L/sec; depositing a conductive layer over the liner layer; and reflowing the conductive layer. In an embodiment, reflowing the conductive layer includes heating the conductive layer to a temperature from 150° C. to 300° C. for between 10 seconds and 300 seconds. In an embodiment, depositing the conductive layer and reflowing the conductive layer are repeated from 1 to 5 times to form the conductive feature. In an embodiment, the method further includes planarizing the dielectric layer, the barrier layer, the liner layer, and the conductive feature using a chemical mechanical planarization process. In an embodiment, generating the plasma, pumping the plasma and the process gas, and depositing the conductive layer are performed at a temperature from 5° C. to 50° C. In an embodiment, the conductive feature includes copper, the process gas includes argon, and the process gas is supplied to the process chamber at a flowrate from 8 sccm to 100 sccm while generating the plasma.

In accordance with yet another embodiment, an apparatus includes a process chamber including an inlet and an outlet; a wafer stage in the process chamber; a sputtering target in the process chamber over the wafer stage; and a cryopump connected to the outlet of the process chamber. In an embodiment, the cryopump includes a baffle, the baffle including a plurality of concentric rings connected by support members in a cross-sectional view. In an embodiment, the cryopump includes a baffle. In an embodiment, the cryopump is cooled with liquid hydrogen. In an embodiment, the cryopump has a cooling surface area from 500 cm$^2$ to 4,000 cm$^2$. In an embodiment, the process chamber has a volume from 20 L to 60 L.

In accordance with another embodiment, a device includes a process chamber, the processing chamber coupled to a horizontal plasma inlet. The device also includes a wafer stage in the process chamber, the wafer stage configured to hold a wafer. The device also includes a sputtering target in the process chamber over the wafer stage, the horizontal plasma inlet disposed vertically between the sputtering target and the wafer stage. The device also includes a cryopump connected to a horizontal outlet of the process chamber, the cryopump configured to reduce a first pressure of the process chamber after plasma ignition to a second pressure between about 0.1% and 3% of the first pressure during a deposition process. In an embodiment, the cryopump includes a baffle system having an effective surface area between 500 cm$^2$ and 4000 cm$^2$. In an embodiment, the cryopump is configured to condense effluents of a plasma on the baffle system. In an embodiment, the device further includes a sealing element between the process chamber and the cryopump, the sealing element configured to seal the process chamber off from the cryopump during a regeneration process of the cryopump, the regeneration process evaporating the condensed effluents. In an embodiment, the device further includes a refrigerator coupled to the cryopump, the refrigerator configured to provide liquid nitrogen or liquid hydrogen to the cryopump. In an embodiment, the cryopump includes two or more stages, each of the two or more stages configured to be cooled to separate and distinct temperatures.

In accordance with another embodiment, an apparatus includes a deposition apparatus, the deposition apparatus including: a process chamber, a wafer holding platform, a target material, and a plasma generator coupled to the process chamber. The apparatus also includes a cryopump coupled to the deposition apparatus, the cryopump configured to operate in a timed relationship to the plasma generator. The apparatus also includes a refrigerator, the refrigerator configured to provide one or more liquid coolants to the cryopump. In an embodiment, the cryopump includes a first stage configured to have a temperature maintained between −190° C. and −160° C. during a deposition process and a second stage configured to have a temperature maintained between −260° C. and −240° C. during the deposition process. In an embodiment, the refrigerator is configured to provide liquid nitrogen to a first stage of the cryopump and where the refrigerator is configured to provide liquid hydrogen to the a second stage of the cryopump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a process chamber comprising an inlet and an outlet;
   a wafer stage in the process chamber;
   a sputtering target in the process chamber over the wafer stage; and
   a cryopump connected to the outlet of the process chamber, the cryopump comprising a baffle, the baffle comprising at least three concentric rings connected by support members, the baffle having a width and a height, the width being greater than the height, the at least three concentric rings being ring-shaped in a first plane extending in the width direction, the first plane being perpendicular to a major surface of the wafer stage,
   wherein the cryopump comprises a first stage configured to have a temperature maintained between −190° C. and −160° C. during a deposition process and a second stage configured to have a temperature maintained between −260° C. and −240° C. during the deposition process,
   wherein the first stage is closer to the process chamber than the second stage, and
   wherein the cryopump is configured to reduce a pressure of the process chamber from a first pressure of greater than 10 mTorr to a second pressure less than 0.3 mTorr in less than 8 seconds during an intermediate stage between a plasma ignition stage and a deposition stage of a physical vapor deposition process.

2. The apparatus of claim 1, wherein the cryopump is cooled with liquid hydrogen.

3. The apparatus of claim 1, wherein the cryopump has a cooling surface area from 500 cm$^2$ to 4,000 cm$^2$.

4. The apparatus of claim 3, wherein the process chamber has a volume from 20 L to 60 L.

5. The apparatus of claim 1 further comprising:
   a refrigerator fluidly coupled to the cryopump, the refrigerator configured to provide one or more liquid coolants to the cryopump.

6. The apparatus of claim 1, wherein the cryopump is configured to condense effluents of a plasma on the baffle, and wherein the apparatus further comprises a refrigerator fluidly coupled to the cryopump, the refrigerator configured to provide liquid nitrogen to a first stage of the cryopump and liquid helium to a second stage of the cryopump.

7. The apparatus of claim 1, wherein the process chamber is maintained at a temperature between 5° C. and 50° C. throughout a three-stage deposition process.

8. The apparatus of claim 1, further comprising a sealing element disposed between the process chamber and the cryopump, wherein the sealing element is configured to seal the process chamber off from the cryopump during a regeneration process, and wherein the baffle is configured to be heated during the regeneration process to evaporate the condensed effluents such that the effluent gas does not reenter the process chamber.

9. The apparatus of claim 1, wherein the deposition process comprises: depositing a conductive layer during the deposition stage at a DC power supplied to a target from 30 kW to 50 kW, wherein a concentration of source particles in the process chamber at an end of the intermediate stage is from 90% to 99.9% of particles in the process chamber.

10. The apparatus of claim 1, wherein during the plasma ignition stage, a process gas is supplied to the process chamber at a flowrate from 40 sccm to 60 sccm, and wherein during the intermediate stage, supply of the process gas to the process chamber is stopped.

11. The apparatus of claim 1, wherein during the deposition stage, an AC bias power from 450 W to 550 W, an electromagnetic field supplied with a current from 17.5 A to 22.5 A, and a DC shield bias power from 85 V to 95 V are applied to control the deposition of a conductive layer.

12. A device comprising:
a process chamber, the processing chamber coupled to a horizontal plasma inlet;
a wafer stage in the process chamber, the wafer stage configured to hold a wafer;
a sputtering target in the process chamber over the wafer stage, the horizontal plasma inlet disposed vertically between the sputtering target and the wafer stage;
a cryopump connected to a horizontal outlet of the process chamber, the cryopump configured to reduce a first pressure of the process chamber after plasma ignition to a second pressure between about 0.1% and 3% of the first pressure during a deposition process, the cryopump comprising a first stage and a second stage, the cryopump comprising a baffle, the baffle comprising at least three concentric rings connected by support members in a cross-sectional view, wherein the cross-sectional view of the baffle is along a plane perpendicular to a major surface of the wafer stage, wherein the cryopump is configured to reduce a pressure of the process chamber from a first pressure of greater than 10 mTorr to a second pressure less than 0.3 mTorr in less than 8 seconds; and
a refrigerator coupled to the cryopump, the refrigerator configured to provide liquid nitrogen to the first stage of the cryopump and liquid helium to the second stage, the first stage being closer to the process chamber than the second stage.

13. The device of claim 12, wherein the cryopump comprises a baffle system having an effective surface area between 500 $cm^2$ and 4000 $cm^2$.

14. The device of claim 13, wherein the cryopump is configured to condense effluents of a plasma on the baffle system.

15. The device of claim 14, further comprising a sealing element between the process chamber and the cryopump, the sealing element configured to seal the process chamber off from the cryopump during a regeneration process of the cryopump, the regeneration process evaporating the condensed effluents.

16. The device of claim 12, wherein the cryopump includes more than two stages, each of the more than two stages configured to be cooled to separate and distinct temperatures.

17. The device of claim 12, wherein the cryopump comprises a first stage configured to have a temperature maintained between −190° C. and −160° C. during a deposition process and a second stage configured to have temperature maintained between −260° C. and −240° C. during a deposition process.

18. An apparatus comprising:
a deposition apparatus, the deposition apparatus including:
a process chamber,
a wafer holding platform,
a target material, and
a plasma generator coupled to the process chamber;
a cryopump coupled to the deposition apparatus, the cryopump configured to operate in a timed relationship to the plasma generator, the cryopump comprising a baffle, the baffle comprising at least three concentric rings connected by support members in a cross-sectional view, the baffle having a width and a height, the width being greater than the height, the at least three concentric rings being ring-shaped in a first plane extending in the width direction, the first plane being perpendicular to a major surface of the wafer holding platform, wherein the cryopump is configured to reduce a pressure of the process chamber from a first pressure of greater than 10 mTorr to a second pressure less than 0.3 mTorr in less than 8 seconds; and
a refrigerator, the refrigerator configured to provide one or more liquid coolants to the cryopump.

19. The apparatus of claim 18, wherein the cryopump comprises a first stage configured to have a temperature maintained between −190° C. and −160° C. during a deposition process and a second stage configured to have a temperature maintained between −260° C. and −240° C. during the deposition process.

20. The apparatus of claim 18, wherein the refrigerator is configured to provide liquid nitrogen to a first stage of the cryopump and wherein the refrigerator is configured to provide liquid hydrogen to a second stage of the cryopump.

* * * * *